(12) United States Patent
Wang

(10) Patent No.: US 10,971,480 B2
(45) Date of Patent: Apr. 6, 2021

(54) DISPLAY PANEL, MANUFACTURING METHOD THEREOF AND DISPLAY DEVICE

(71) Applicant: Shenzhen China Star Optoelectronics Technology Co., Ltd., Guangdong (CN)

(72) Inventor: Zhiwu Wang, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 534 days.

(21) Appl. No.: 15/763,184

(22) PCT Filed: Jan. 18, 2018

(86) PCT No.: PCT/CN2018/073289
§ 371 (c)(1),
(2) Date: Mar. 26, 2018

(87) PCT Pub. No.: WO2019/010946
PCT Pub. Date: Jan. 17, 2019

(65) Prior Publication Data
US 2020/0258866 A1 Aug. 13, 2020

(30) Foreign Application Priority Data
Jul. 10, 2017 (CN) .......................... 201710556199.X

(51) Int. Cl.
H01L 25/075 (2006.01)
H01L 27/12 (2006.01)
(Continued)

(52) U.S. Cl.
CPC ...... *H01L 25/0753* (2013.01); *H01L 27/1222* (2013.01); *H01L 29/78675* (2013.01); *H01L 33/62* (2013.01); *H01L 2933/0066* (2013.01)

(58) Field of Classification Search
CPC ............. H01L 25/0753; H01L 27/1222; H01L 25/167; H01L 2933/0091; H01L 51/5268
See application file for complete search history.

(56) References Cited

U.S. PATENT DOCUMENTS 10,021,762 B1 * 7/2018 Tsai ........................ H01L 51/56
2015/0349205 A1 * 12/2015 Chen .................... H01L 33/145
257/99

FOREIGN PATENT DOCUMENTS

CN 102130244 A 7/2011
CN 103219432 A 7/2013
(Continued)

Primary Examiner — Tucker J Wright
(74) Attorney, Agent, or Firm — Leong C. Lei

(57) ABSTRACT

The present invention provides a display panel and a manufacturing method thereof. The display panel comprises a micro light emitting diode and a thin film transistor electrically coupled to the micro light emitting diode. The micro light emitting diode comprises a P type semiconductor and a N type semiconductor. The P type semiconductor is close to the thin film transistor and the N type semiconductor is configured at one side of the P type semiconductor away from the thin film transistor. One surface of the N type semiconductor away from the P type semiconductor is roughened by a plasma surface treatment process. Since a thickness of the N type semiconductor is larger than a thickness of the P type semiconductor, the crystal quality of material of the N type semiconductor will not be affected as the N type semiconductor is roughened to increase the light efficiency.

10 Claims, 6 Drawing Sheets

(51) Int. Cl.
*H01L 29/786* (2006.01)
*H01L 33/62* (2010.01)

(56) References Cited

FOREIGN PATENT DOCUMENTS

| CN | 105324858 A | 2/2016 |
| CN | 107331670 A | 11/2017 |

\* cited by examiner

DISPLAY PANEL, MANUFACTURING METHOD THEREOF AND DISPLAY DEVICE

CROSS REFERENCE

The present application claims the priority of China Application No. 201710556199.X, filed Jul. 10, 2017.

FIELD OF THE INVENTION

The present invention relates to a display field, and more particularly to a display panel and a manufacturing method thereof, and a display device.

BACKGROUND OF THE INVENTION

A micro light emitting diode (Micro LED) consumes only one-tenth the power of a liquid crystal display (LCD). The Micro LED is a self-luminous device like an organic light-emitting diode (OLED) and possesses the properties of low power consumption, small thickness, small mass, small volume, low power consumption and fast response without the bad color decline of the OLED, thus becoming the industry research hot spot.

In prior art, as the Micro LED chip is electrically coupled to the thin film transistor (TFT), the N type semiconductor is close to the TFT and the P type semiconductor is configured at one side of the N type semiconductor away from the TFT. The light is emitted from the light emitting layer configured between the P type semiconductor and the N type semiconductor and enters the P type semiconductor for emission. However, as the light outgoing surface of the P type semiconductor is smooth, the total reflection causes a portion of the light to re-enter the light emitting layer to be converted into heat, and resulting in decreasing light efficiency. Thus, for increasing the light emission, the P type semiconductor is roughened to decrease the total reflection of the light to increase the light efficiency. However, since the P type semiconductor is relatively thinner and the thickness is within 200 nm. Roughening the P type semiconductor will result in the bad crystal quality of the P type semiconductor material, and thereby increasing the leakage current of the Micro LED chip.

SUMMARY OF THE INVENTION

The present invention provides a display panel, which can reduce the generation of the leakage current of a Micro LED while increasing light efficiency.

The display panel comprises a thin film transistor, a micro light emitting diode configured above the thin film transistor and electrically coupled to the thin film transistor, wherein the micro light emitting diode comprises a P type semiconductor, a N type semiconductor oppositely configured to the P type semiconductor and a light emitting layer configured between the P type semiconductor and the N type semiconductor, and the N type semiconductor is configured at one side of the P type semiconductor away from the thin film transistor, a thickness of the N type semiconductor is larger than a thickness of the P type semiconductor, one side of the N type semiconductor away from the P type semiconductor is a rough surface.

The display panel further comprises a passivation layer and an organic layer, wherein the organic layer is stacked on the thin film transistor and an open groove is configured in the organic layer, the micro light emitting diode is accepted in the open groove and is electrically coupled to the thin film transistor; the passivation layer is stacked and covers on the organic layer and the micro light emitting diode.

The passivation layer is an organic insulating film layer or an inorganic insulating film layer.

The display panel further comprises a first electrode and a second electrode, wherein the first electrode is stacked on the thin film transistor and is configured in the open groove of the organic layer, the thin film transistor comprises a source and a drain, one end of the first electrode is coupled to the source and the drain, another end of the first electrode is electrically coupled to the P type semiconductor; the second electrode is stacked on the passivation layer and one end of the second electrode is electrically coupled to the N type semiconductor by penetrating through the passivation layer.

One surface of the P type semiconductor facing the first electrode is stacked with a transparent conductive layer; the first electrode is electrically coupled to the P type semiconductor with the transparent conductive layer.

One side of the N type semiconductor away from the P type semiconductor is configured with an N type metal electrode; the second electrode is electrically coupled to the N type semiconductor with the N type metal electrode.

The thickness of the N type semiconductor is larger than 2 μm and the thickness of the P type semiconductor is smaller than 200 nm.

The present invention further provides a manufacturing method of a display panel, comprising steps of:

providing a substrate formed with a thin film transistor and an organic layer, wherein the organic layer is stacked on the thin film transistor and an open groove is formed in the organic layer;

configuring a micro light emitting diode in the open groove and electrically coupling the micro light emitting diode with the thin film transistor, wherein the micro light emitting diode comprises a P type semiconductor, a N type semiconductor oppositely configured to the P type semiconductor and a light emitting layer configured between the P type semiconductor and the N type semiconductor, the N type semiconductor is configured at one side of the P type semiconductor away from the thin film transistor, and a thickness of the N type semiconductor is larger than a thickness of the P type semiconductor;

processing one surface of the N type semiconductor away from the P type semiconductor by a plasma surface treatment process to roughen the one surface of the N type semiconductor away from the P type semiconductor;

forming a passivation layer on the organic layer and the micro light emitting diode;

forming a second electrode on the passivation layer, wherein one end of the second electrode is coupled to the N type semiconductor.

A plasma forming gas in the plasma surface treatment process is any one or more of H2, Ar, N2 and NH3.

The present invention further provides a display device, comprising a device main body and the aforesaid display panel. The display panel is electrically connected to the device main body. In the display panel provided by the present invention, as the Micro LED chip is electrically coupled to the thin film transistor (TFT), the P type semiconductor is close to the TFT and the N type semiconductor is configured at one side of the P type semiconductor away from the TFT, and one surface of the N type semiconductor away from the P type semiconductor is processed to be a rough surface. Since a thickness of the N type semiconductor is larger than a thickness of the P type semiconductor, the crystal quality of material of the N type semiconductor will not be affected as the N type semiconductor is roughened to increase the light efficiency and to prevent the generation of leakage current of the Micro LED chip.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
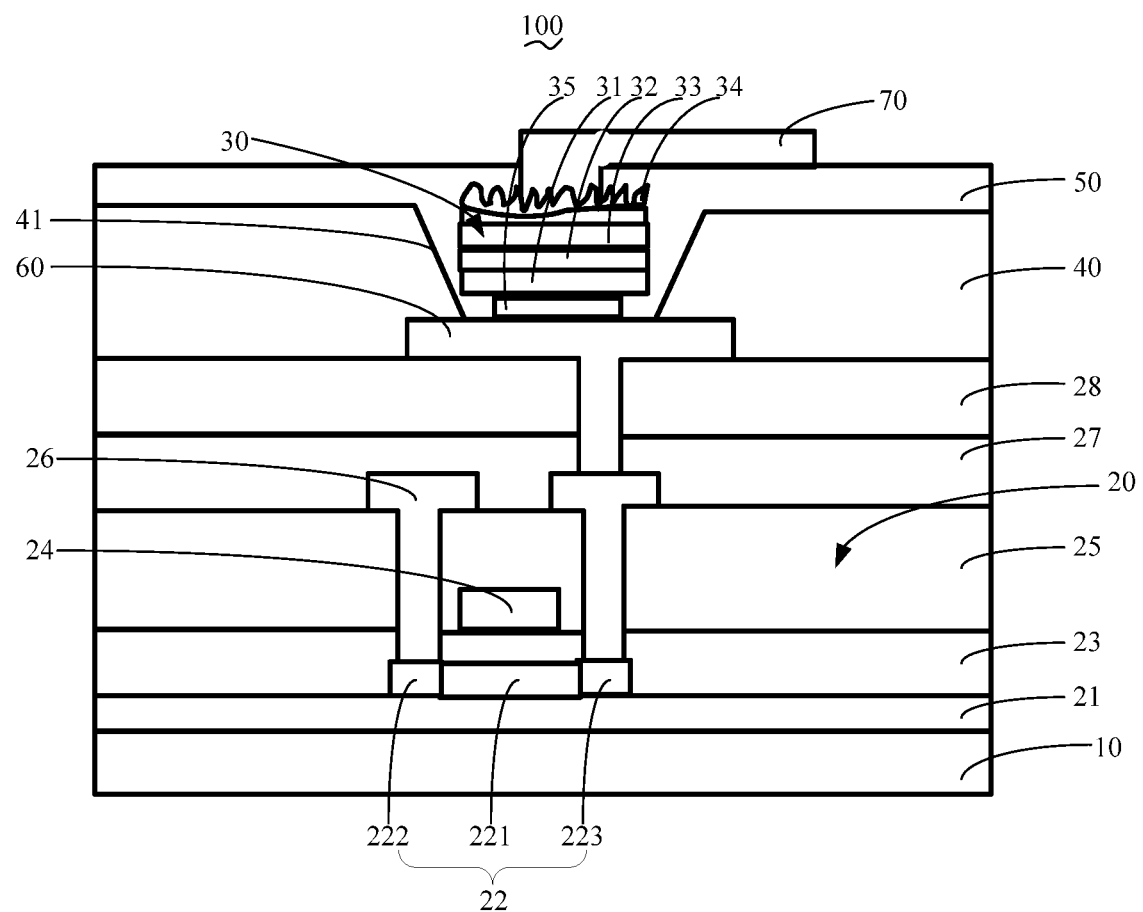
FIG. 1 is a structure diagram of a display panel according to the embodiment of the present invention.

Please refer to FIG. 1. The present invention provides a display panel 100. The display panel 100 comprises a substrate 10, a thin film transistor 20 configured on the substrate 10 and a micro light emitting diode 30 configured on the thin film transistor 20 and electrically coupled to the thin film transistor 20.

The substrate 10 can be a rigid substrate or a flexible substrate. In this embodiment, the substrate 10 is a rigid glass substrate.

In this embodiment, the thin film transistor 20 is a LTPS-TFT. The thin film transistor 20 comprises a buffer layer 21, an active layer 22, a gate insulation layer 23, a gate 24, a dielectric layer 25 a source and a drain 26, a barrier layer 27 and a planarization layer 28. The buffer layer 21 is stacked and covers on the substrate 10. The active layer 22 is stacked on the buffer layer 21. The active layer 22 comprises a channel layer 221 and a first doped region 222 and a second doped region 223, which are respectively at two sides of the channel layer 221. The gate insulation layer 23 covers the active layer 22 and the buffer layer 21, which is not covered by the active layer 22. The gate 24 is stacked on the gate insulation layer 23 and a projection in a vertical direction is inside the channel layer 221. The dielectric layer 25 is stacked on the gate 24 and covers on the gate 24 and the gate insulation layer 23, which is not covered by the gate 24. Two through holes extend from one surface of the dielectric layer 25 away from the gate insulation layer 23 to the active layer 22. The two through holes are respectively above the first doped region 222 and the second doped region 223. The source 26 and the drain 26 are configured on the dielectric layer 25. The source and the drain are respectively coupled to the first doped region 222 and the second doped region 223 with the through holes penetrating the dielectric layer 25 and the gate insulation layer 23. The barrier layer 27 is stacked on the source and the drain 26, and covers on the source and the drain 26 and the dielectric layer 25, which is not covered by the source and the drain 26. The planarization layer 28 is stacked on the barrier layer 27. A via extends from one surface of the planarization layer 28 away from the barrier layer 27 to the inside of the planarization layer 28. The via extends to reach the source and the drain 26. It can be understood that the thin film transistor 20 can also be a thin film transistor of other type, such as a TFT, a LTPS-TFT or a HTPS-TFT depending on actual needs.

The micro light emitting diode 30 comprises a transparent conductive layer 31, a P type semiconductor 32, a light emitting layer 33 and a N type semiconductor 34, which are sequentially stacked up. The P type semiconductor 32 is opposite to and parallel with the N type semiconductor 34. The light emitting layer 33 is configured between the P type semiconductor 32 and the N type semiconductor 34. The P type semiconductor 32 is attached with the transparent conductive layer 31 to achieve the electrical connection of the P type semiconductor 32 and the transparent conductive layer 31. Meanwhile, the P type semiconductor 32 is electrically coupled with the thin film transistor 20 with the transparent conductive layer 31. With the transparent conductive layer 31, the current or the voltage transmitted by the thin film transistor 20 is uniformly distributed on the P type semiconductor 32 to promote the uniform light emission at all positions of the light emitting layer 33.

The N type semiconductor 34 is configured at one side of the P type semiconductor 32 away from the thin film transistor 20, and one surface of the N type semiconductor 34 away from the P type semiconductor 32 is a rough surface. By arranging the surface of the N type semiconductor 34 away from the P type semiconductor 32 to be a rough surface, the light efficiency of the light emitted by the light emitting layer 33 between the N type semiconductor and the P type semiconductor out from the side of the N type semiconductor increases. Meanwhile, for reducing lattice defects of the N type semiconductor 34 as possible, the thickness of the N type semiconductor 34 is larger than the thickness of the P type semiconductor 32 in general. Therefore, one surface of the N type semiconductor 34 is arranged to be a rough surface to not to affect the crystal quality in the N type semiconductor 34 and thus, the leakage current of the Micro LED chip 30 does not increase for reducing the generation of the leakage current of the Micro LED chip 30 as increasing the light efficiency. In the present invention, the thickness of the N type semiconductor is larger than 2 μm and the thickness of the P type semiconductor is smaller than 200 nm. Furthermore, the surface of the N type semiconductor 34 away from the P type semiconductor 32 is further configured with a N type metal electrode in this embodiment.

The display panel 100 further comprises an organic layer 40, a passivation layer 50, a first electrode 60 and a second electrode 70. The organic layer 40 is stacked on the thin film transistor 20. The organic layer 40 is configured with an open groove 41. The micro light emitting diode 30 is accepted inside the open groove 41. The passivation layer 50 is stacked on the organic layer 40 and covers the micro light emitting diode 30. The passivation layer 50 is an organic insulating film layer or an inorganic insulating film layer.

The first electrode 60 is configured on the planarization layer 28 of the thin film transistor 20 and is embedded in the organic layer 40. Namely, the organic layer 40 covers on the first electrode 60 and the planarization layer 28, which is not covered by the first electrode 60. Meanwhile, the bottom of the open groove 41 is the first electrode 60. Namely, the open groove 41 is configured in the organic layer 40 and a portion of the first electrode 60 is exposed. One end of the first electrode 60 is electrically coupled to the source 26 and the drain 26 of the thin film transistor 20 with the via. The other end of the first electrode 60 is electrically coupled to the transparent conductive layer 31 with a bonding material layer 35. Thus, the electrical connection of the micro light emitting diode 30 and the thin film transistor 20 are achieved with the first electrode 60. The second electrode 70 is stacked on the passivation layer 40. One end of the second electrode 70 is electrically coupled to the N type metal electrode 35 with a through hole on the passivation layer 40. In the present invention, the second electrode 70 is configured above the passivation layer 40. With the passivation layer 40, the first electrode 60 and the second electrode 70 are insulated and separated to avoid the short circuit generated by the first electrode 60 and the second electrode 70.

In the present invention, a current is supplied to the micro light emitting diode 30 with the first electrode 60 and the second electrode 70 such that the light emitting layer 33 of the micro light emitting diode 30 emits light and the light emits out through the N type semiconductor 34. Furthermore, since one side of the N type semiconductor 34 away from the P type semiconductor 32 is a rough surface, the total reflection of the light by the N type semiconductor is reduced to increase the light efficiency of the N type semiconductor. Furthermore, since the thickness of the N type semiconductor 34 is larger, as arranging one surface of the N type semiconductor 34 to be a rough surface, the crystal quality in the N type semiconductor 34 will not be affected and thus, the leakage current of the Micro LED chip 30 does not increase for reducing the generation of the leakage current of the Micro LED chip 30 as increasing the light efficiency.

Figure 2:
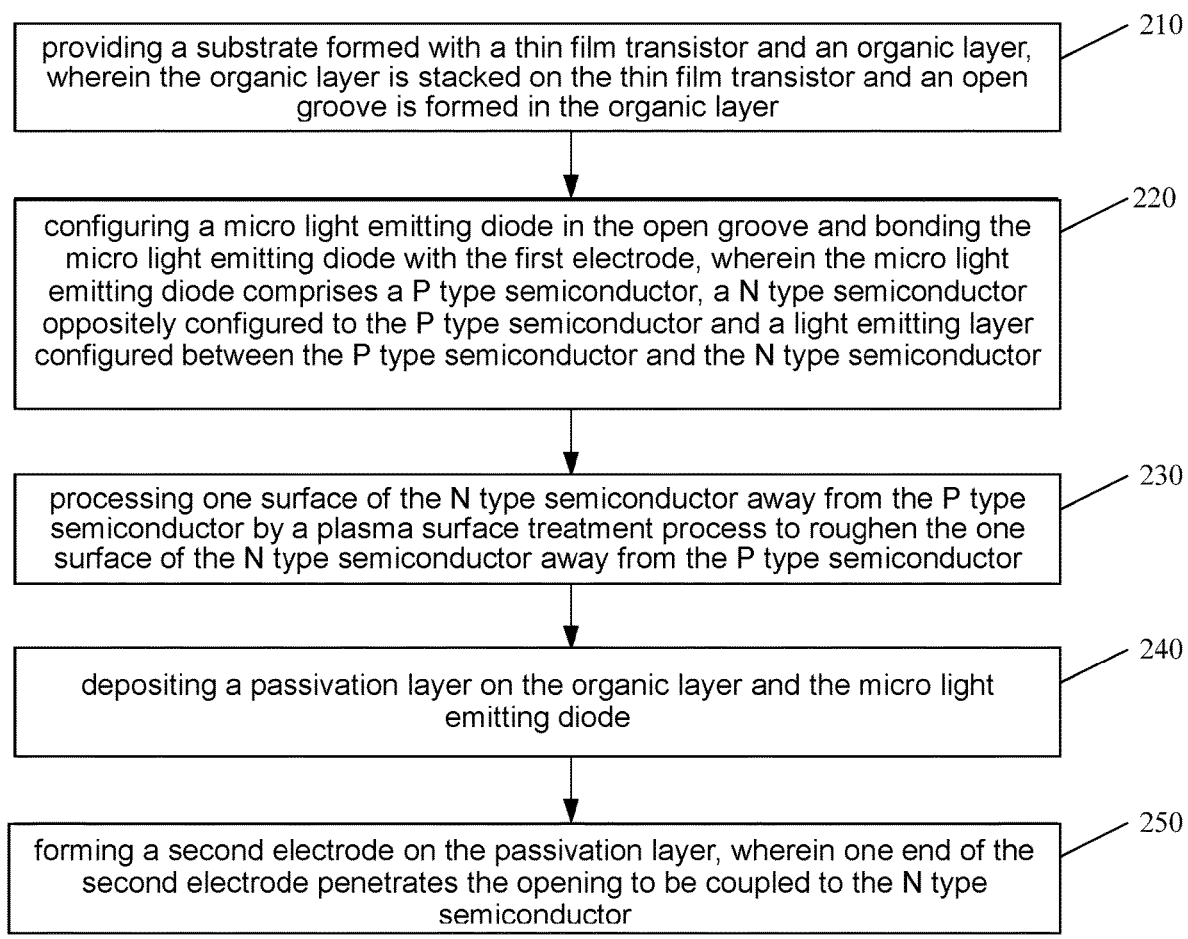
FIG. 2 is a manufacturing flowchart of the display panel in FIG. 1 according to the embodiment of the present invention.

Please refer to FIG. 2. The manufacturing method of the display panel 100 according to the present invention comprises:

Step 210, providing a substrate 10 formed with a thin film transistor 20 and an organic layer 40, wherein the organic layer 40 is stacked on the thin film transistor 20 and an open groove 41 is formed in the organic layer 40.

Figure 3:
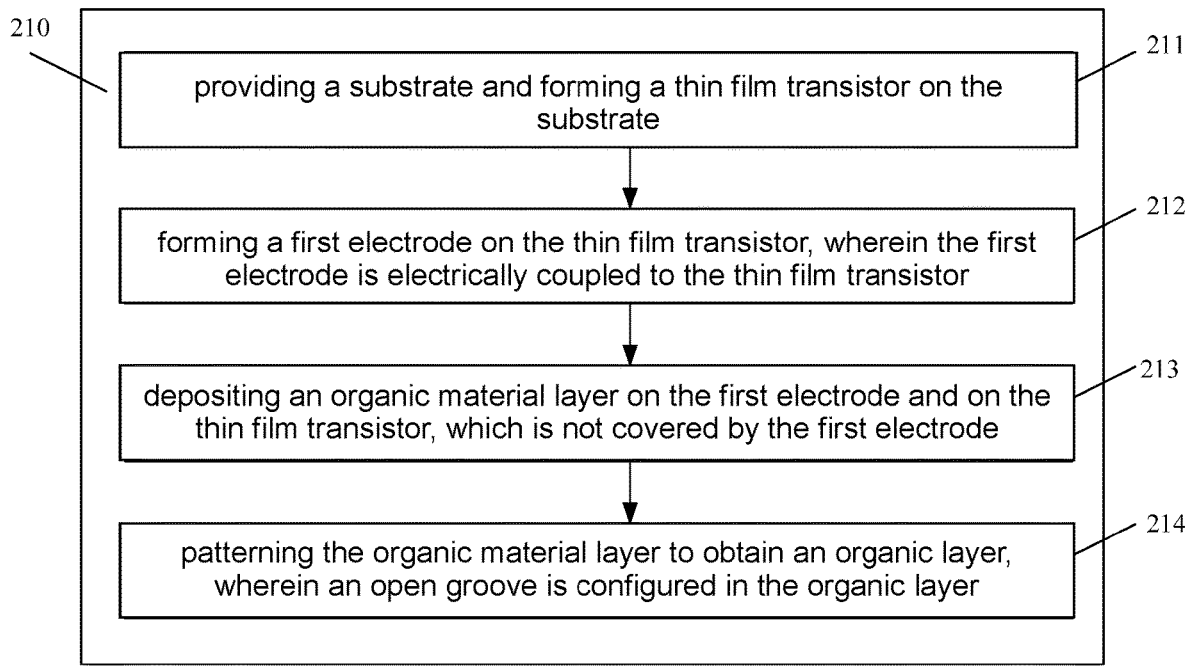
FIG. 3 is a specific flowchart of a step "providing a substrate formed with a thin film transistor and an organic layer and forming an open groove in the organic layer" as manufacturing the display panel according to the embodiment of the present invention.
Figure 4:
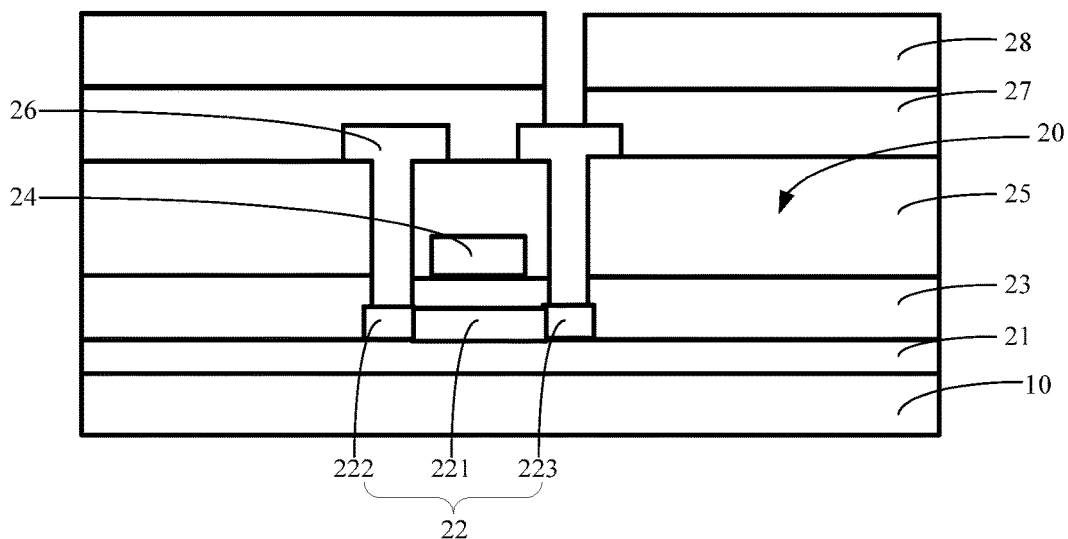
FIG. 4 to FIG. 10 are sectional diagrams of respective manufacturing steps of the display panel according to the embodiment of the present invention.
Figure 5:
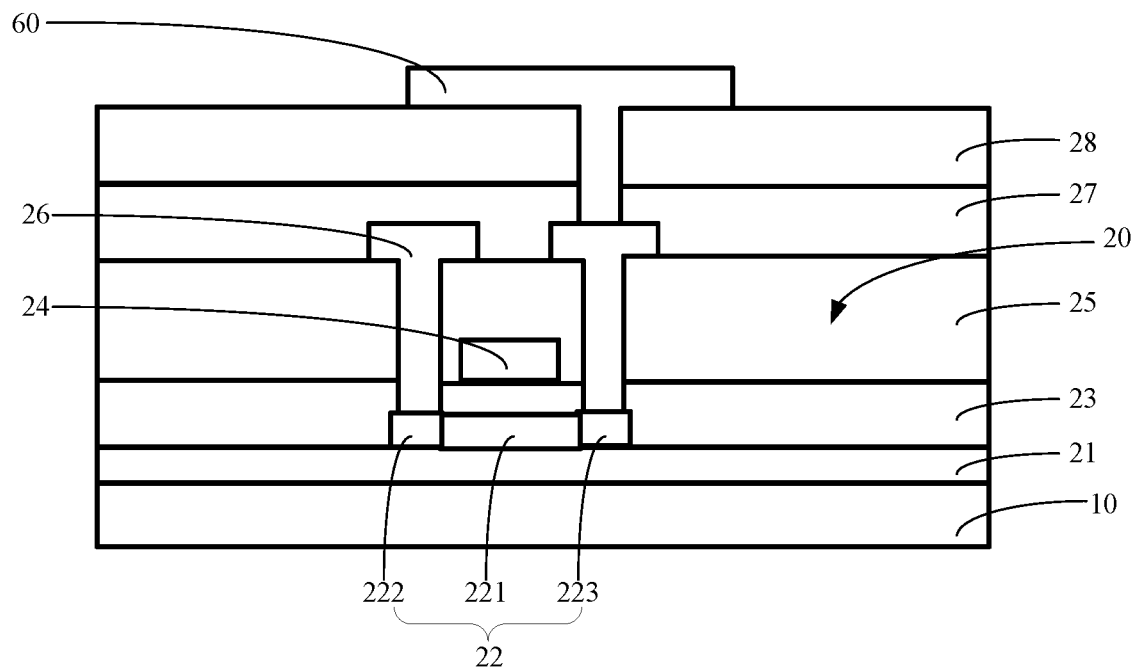

Specifically, referring to FIG. 3, Step 210 comprises:

Step 211, as shown in FIG. 4, providing a substrate 10 and forming a thin film transistor 20 on the substrate 10. The substrate 10 can be a rigid substrate or a flexible substrate. In this embodiment, the substrate 10 is a rigid glass substrate.

In this embodiment, the thin film transistor 20 is a LTPS-TFT. The thin film transistor 20 comprises a buffer layer 21, an active layer 22, a gate insulation layer 23, a gate 24, a dielectric layer 25 a source and a drain 26, a barrier layer 27 and a planarization layer 28. The buffer layer 21 is formed on the substrate 10 by vapor deposition, spin coating or inkjet printing such that the buffer layer 21 is stacked and covers on the substrate 10. The active layer 22 is formed on the buffer layer 21 and the active layer 22 is stacked on the buffer layer 21. Two ends of the active layer 22 are doped with N ions and P ions, respectively such that the active layer 22 forms a channel layer 221, and a first doped region 222 and a second doped region 223 respectively configured at two sides of the channel layer 221. The gate insulation layer 23 is formed on the active layer 22 and on the buffer layer 21, which is not covered by the active layer 22. The gate insulation layer 23 covers on the active layer 22 and on the buffer layer 21, which is not covered by the active layer 22. The gate 24 is formed on the gate insulation layer 23 and a projection in a vertical direction of the gate 24 is inside the channel layer 221. The dielectric layer 25 is formed on the gate 24 and on the gate insulation layer 23, which is not covered by the gate 24. The dielectric layer 25 covers on the gate 24 and the gate insulation layer 23, which is not covered by the gate 24. Two through holes are formed and extend from one surface of the dielectric layer 25 away from the gate insulation layer 23 to the active layer 22. The two through holes are respectively above the first doped region 222 and the second doped region 223. The source 26 and the drain 26 are formed on the dielectric layer 25. The source 26 and the drain 26 are respectively coupled to the first doped region 222 and the second doped region 223 with the through holes penetrating the dielectric layer 25 and the gate insulation layer 23. The barrier layer 27 is formed on the source and the drain 26. The barrier layer 27 covers on the source and the drain 26 and on the dielectric layer 25, which is not covered by the source and the drain 26. The planarization layer 28 is formed on the barrier layer 27. A via extends from one surface of the planarization layer 28 away from the barrier layer 27 to the source and the drain 26. The via is above the source and the drain 26. It can be understood that the thin film transistor 20 can also be a thin film transistor of other type, such as a TFT or a HTPS-TFT depending on actual needs.

Step 212, as shown in FIG. 4, forming a first electrode 60 on the thin film transistor 20, wherein the first electrode 60 is electrically coupled to the thin film transistor 20.

A first metal layer is formed on the planarization layer 28 of the thin film transistor 20 by electroplating, magnetron sputtering or vapor deposition. Then, the first metal layer is patterned in advance to obtain the first electrode 60. The first electrode 60 is electrically coupled to the source and the drain 26 with the via.

Figure 6:
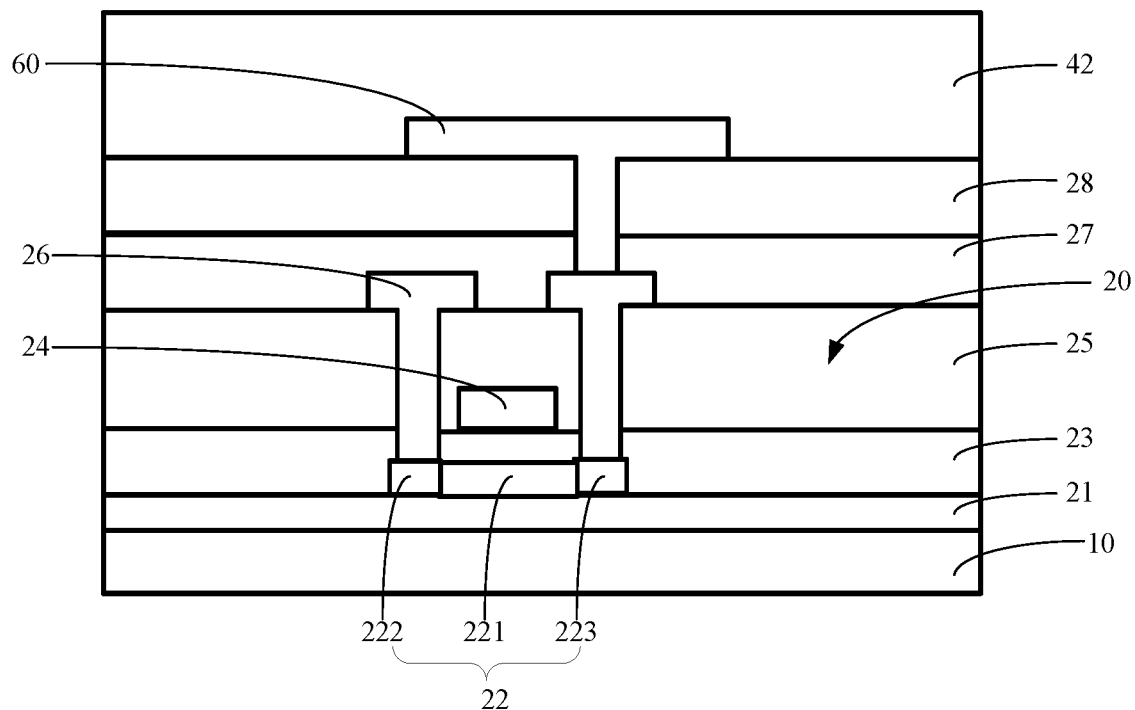

Step 213, as shown in FIG. 6, depositing an organic material layer 42 on the first electrode 60 and on the thin film transistor 20, which is not covered by the first electrode 60.

In this embodiment, the organic material layer 42 is an organic photoresist material. The organic material layer is formed on the first electrode 60 and on the thin film transistor 20, which is not covered by the first electrode 60 by spin coating or inkjet printing.

Figure 7:
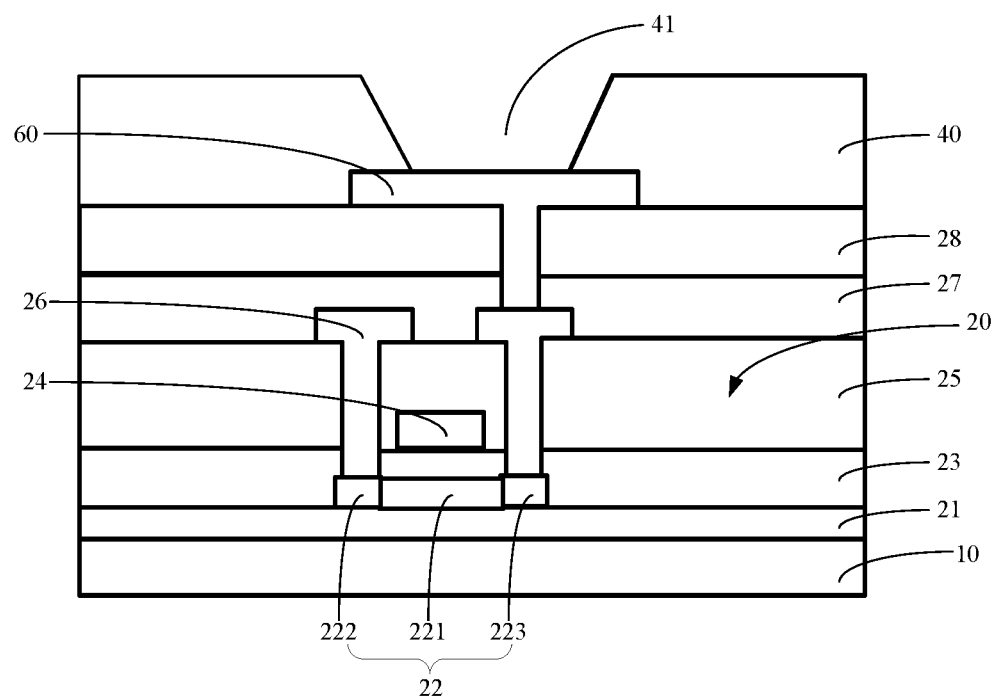

Step 214, as shown in FIG. 7, patterning the organic material layer 42 to obtain an organic layer 40, wherein an open groove is configured in the organic layer 40.

The organic material layer 42 is patterned by exposure and development to obtain the organic layer 40. The organic layer 40 comprises the open groove 41. The open groove 41 has a truncated cone shape with an opening direction away from the thin film transistor 20. A size of the opening is larger than a size of the bottom. In the present invention, the organic material layer 42 is patterned to remove the organic material layer 42 covering the first electrode 60 to expose the first electrode 60 and to form the open groove 41 such that the bottom of the open groove 41 is the first electrode 60.

Figure 8:
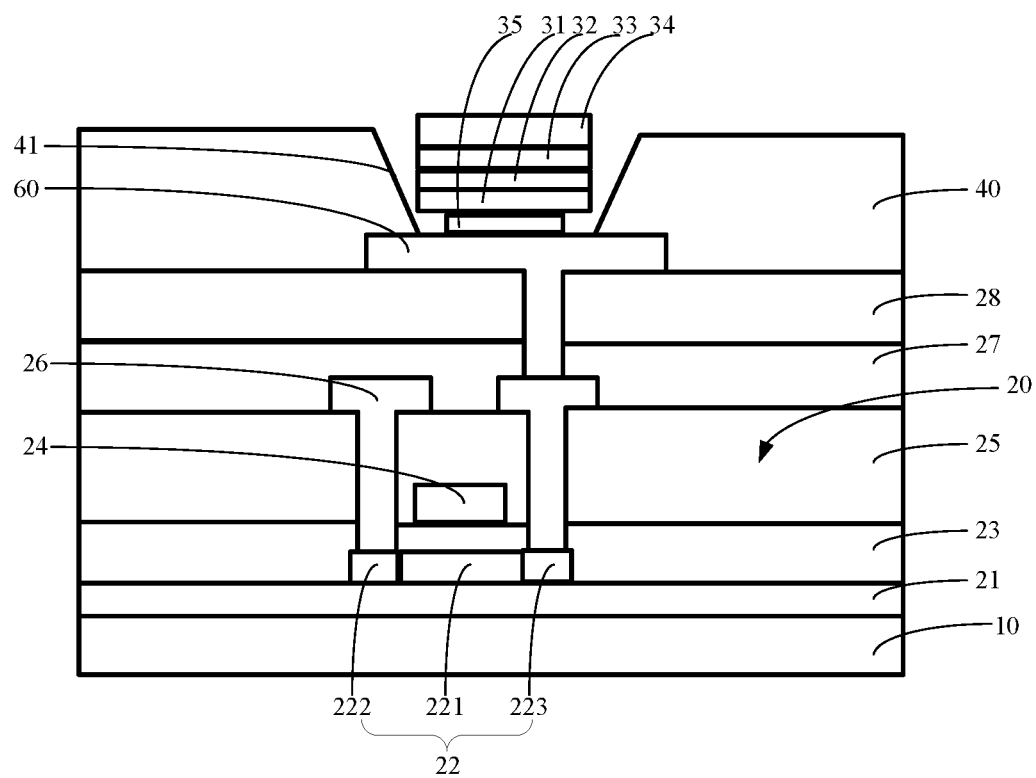

Step 220, as shown in FIG. 8, configuring a micro light emitting diode 30 in the open groove 41 and bonding the micro light emitting diode 30 with the first electrode 60. The micro light emitting diode 30 comprises a P type semiconductor 32, a N type semiconductor 34 oppositely configured to the P type semiconductor 32 and a light emitting layer 33 configured between the P type semiconductor 32 and the N type semiconductor 34.

In the present invention, the N type semiconductor 34 is configured at one side of the P type semiconductor 32 away from the thin film transistor 20, and a thickness of the N type semiconductor 34 is larger than a thickness of the P type semiconductor 32. In this embodiment, one side of the P type semiconductor 32 away from the N type semiconductor 34 is further configured with a transparent conductive layer 31. The transparent conductive layer 31 is electrically coupled to the first electrode 60 with a bonding material layer to achieve the electrical connection of the micro light emitting diode 30 and the thin film transistor 20.

Figure 9:
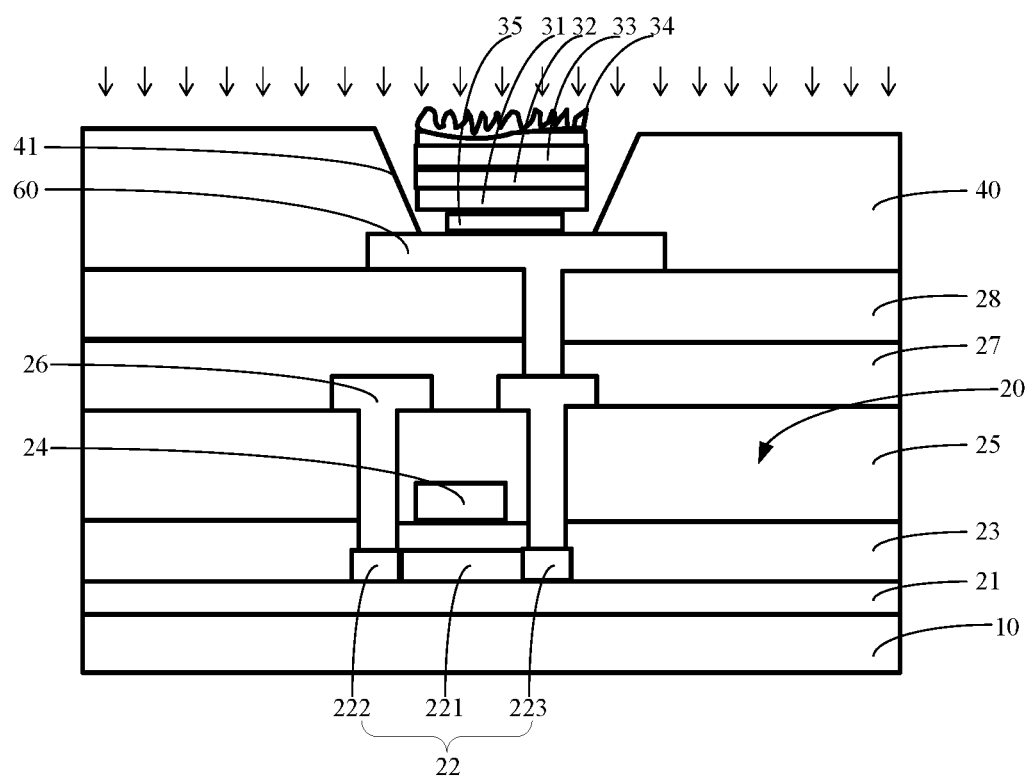

Step 230, as shown in FIG. 9, processing one surface of the N type semiconductor 34 away from the P type semiconductor 32 by a plasma surface treatment process to roughen the one surface of the N type semiconductor 34 away from the P type semiconductor 32.

In this embodiment, the surface of the N type semiconductor 34 away from the P type semiconductor 32 is processed by a plasma surface treatment process. In the plasma surface treatment process, a certain gas is processed to form plasma and the surface of an object is treated by the plasma. In the present invention, a plasma forming gas can also be any one or more of H2, Ar, N2 and NH3. In this embodiment, the plasma forming gas is H2. The one surface of the N type semiconductor 34 away from the P type semiconductor 32 is roughened by a plasma surface treatment process. Thus, the total reflection of the light emitted by the light emitting layer 33 by the N type semiconductor 32 is reduced to increase the light transmission of the display panel 100.

Figure 10:
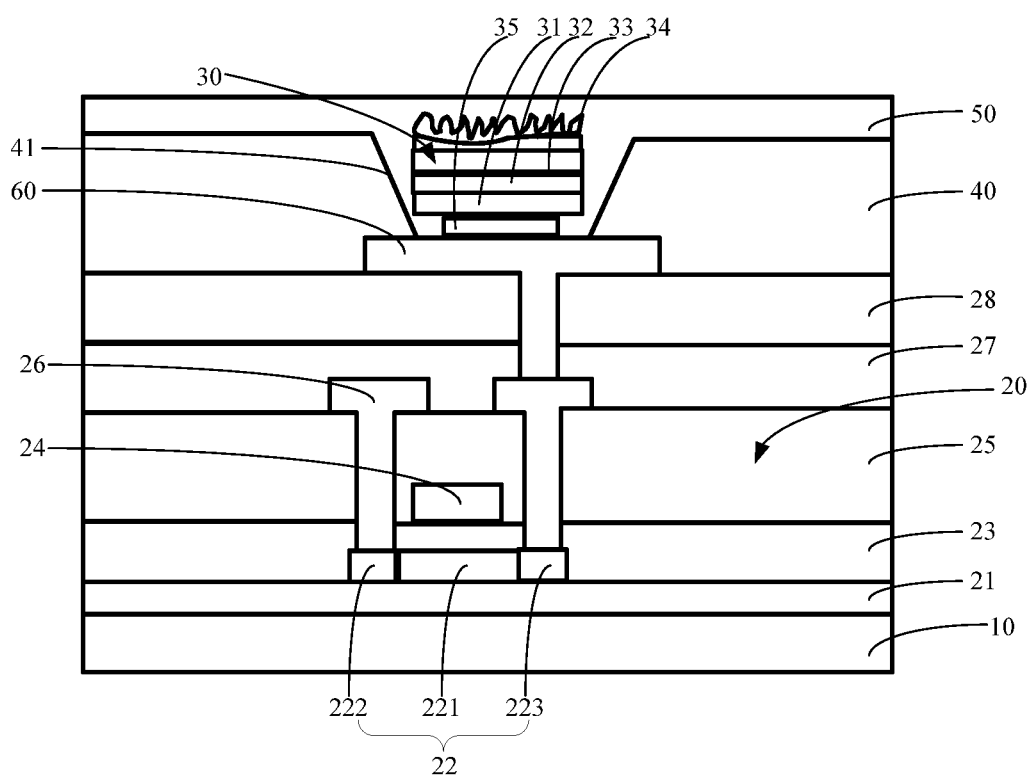

Step 240, as shown in FIG. 10, depositing a passivation layer 50 on the organic layer 40 and the micro light emitting diode 30.

A passivation material layer 51 is deposited on the organic layer 40 and the micro light emitting diode 30 by spin coating or inject printing. The passivation material layer 51 covers on the organic layer 40 and the micro light emitting diode 30. Furthermore, the passivation material layer 51 is patterned to obtain the passivation layer 50. The passivation layer 50 comprises an opening. The opening extends from one surface of the passivation layer 50 away from the organic layer 40 to the inside of the passivation layer 50 to reach the N type semiconductor.

Step S250, back to FIG. 1, forming a second electrode 70 on the passivation layer 50, wherein one end of the second electrode 70 penetrates the opening to be coupled to the N type semiconductor 34.

A second metal layer is formed on the passivation layer 50 by electroplating, magnetron sputtering or vapor deposition. Then, the second metal layer is patterned in advance to obtain the second electrode 70. Furthermore, the second electrode 70 is coupled to the N type semiconductor 34. In this embodiment, a N type metal electrode is further stacked on the N type semiconductor and electrically coupled thereto. With the N type metal electrode, the electrical connection of the second electrode 70 and the N type semiconductor 34 can be achieved such that the electrical connection between the second electrode 70 and the N type semiconductor 34 can be stronger.

The present invention further provides a display device. The display device comprises a device main body and the aforesaid display panel. The display panel is electrically connected to the device main body. The display device can be an electronic display device of a cell phone, a computer, a tablet or a television.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display panel, comprising a thin film transistor, a micro light emitting diode configured above the thin film transistor and electrically coupled to the thin film transistor, wherein the micro light emitting diode comprises a P type semiconductor, a N type semiconductor oppositely configured to the P type semiconductor and a light emitting layer configured between the P type semiconductor and the N type semiconductor, and the N type semiconductor is configured at one side of the P type semiconductor away from the thin film transistor, a thickness of the N type semiconductor being larger than a thickness of the P type semiconductor, one side of the N type semiconductor away from the P type semiconductor being a rough surface,
wherein an organic layer is stacked on the thin film transistor and an open groove is configured in the organic layer, the micro light emitting diode being accepted in the open groove and electrically coupled to the thin film transistor; and a passivation layer is stacked on and covers the organic layer and the micro light emitting diode; and
wherein a first electrode is stacked on the thin film transistor and is configured in the open groove of the organic layer, the thin film transistor comprising a source and a drain, one end of the first electrode being coupled to the source and the drain, another end of the first electrode being electrically coupled to the P type semiconductor; and a second electrode is stacked on the passivation layer, one end of the second electrode being electrically coupled to the N type semiconductor by penetrating through the passivation layer to electrically connect with the rough surface of the N type semiconductor.

2. The display panel according to claim 1, wherein the passivation layer is an organic insulating film layer or an inorganic insulating film layer.

3. The display panel according to claim 1, wherein one surface of the P type semiconductor facing the first electrode is stacked with a transparent conductive layer, and the first electrode is electrically coupled to the P type semiconductor with the transparent conductive layer.

4. The display panel according to claim 1, wherein one side of the N type semiconductor away from the P type semiconductor is configured with a N type metal electrode, and the second electrode is electrically coupled to the N type semiconductor with the N type metal electrode.

5. The display panel according to claim 1, wherein the thickness of the N type semiconductor is larger than 2 μm and the thickness of the P type semiconductor is smaller than 200 nm.

6. A display device, comprising a display device main body and a display panel, in which the display panel is electrically coupled to the display device main body, wherein the display panel comprises a thin film transistor, a micro light emitting diode configured above the thin film transistor and electrically coupled to the thin film transistor, wherein the micro light emitting diode comprises a P type semiconductor, a N type semiconductor oppositely configured to the P type semiconductor and a light emitting layer configured between the P type semiconductor and the N type semiconductor, and the N type semiconductor is configured at one side of the P type semiconductor away from the thin film transistor, a thickness of the N type semiconductor being larger than a thickness of the P type semiconductor, one side of the N type semiconductor away from the P type semiconductor being a rough surface, wherein an organic layer is stacked on the thin film transistor and an open groove is configured in the organic layer, the micro light emitting diode being accepted in the open groove and electrically coupled to the thin film transistor; and a passivation layer is stacked on and covers the organic layer and the micro light emitting diode; and wherein a first electrode is stacked on the thin film transistor and is configured in the open groove of the organic layer, the thin film transistor comprising a source and a drain, one end of the first electrode being coupled to the source and the drain, another end of the first electrode being electrically coupled to the P type semiconductor; and a second electrode is stacked on the passivation layer, one end of the second electrode being electrically coupled to the N type semiconductor by penetrating through the passivation layer to electrically connect with the rough surface of the N type semiconductor.

7. The display device according to claim 6, wherein the passivation layer is an organic insulating film layer or an inorganic insulating film layer.

8. The display device according to claim 6, wherein one surface of the P type semiconductor facing the first electrode is stacked with a transparent conductive layer, and the first electrode is electrically coupled to the P type semiconductor with the transparent conductive layer.

9. The display device according to claim 6, wherein one side of the N type semiconductor away from the P type semiconductor is configured with a N type metal electrode, and the second electrode is electrically coupled to the N type semiconductor with the N type metal electrode.

10. The display device according to claim 6, wherein the thickness of the N type semiconductor is larger than 2 μm and the thickness of the P type semiconductor is smaller than 200 nm.

* * * * *